(12) United States Patent
Karthikeyan et al.

(10) Patent No.: US 7,301,107 B2
(45) Date of Patent: Nov. 27, 2007

(54) SEMICONDUCTOR DEVICE HAVING REDUCED INTRA-LEVEL AND INTER-LEVEL CAPACITANCE

(75) Inventors: Subramanian Karthikeyan, Orlando, FL (US); Sailesh Mansinh Merchant, Orlando, FL (US)

(73) Assignee: Agere Systems, Inc., Berkeley Heights, NJ (US)

( * ) Notice: Subject to any disclaimer, the term of this patent is extended or adjusted under 35 U.S.C. 154(b) by 194 days.

(21) Appl. No.: 10/694,611

(22) Filed: Oct. 27, 2003

(65) Prior Publication Data

US 2004/0084761 A1 May 6, 2004

Related U.S. Application Data

(63) Continuation of application No. 10/152,305, filed on May 20, 2002, now abandoned.

(51) Int. Cl.
*H05K 1/11* (2006.01)
(52) U.S. Cl. .................. 174/262; 174/258; 257/700; 257/702; 257/698
(58) Field of Classification Search ............... 174/258, 174/262; 257/700, 702, 698
See application file for complete search history.

(56) References Cited

U.S. PATENT DOCUMENTS

| | | | |
|---|---|---|---|
| 5,635,423 A * | 6/1997 | Huang et al. | 438/638 |
| 6,087,250 A | 7/2000 | Hyakutake | |
| 6,143,646 A * | 11/2000 | Wetzel | 438/637 |
| 6,159,842 A * | 12/2000 | Chang et al. | 438/622 |
| 6,211,561 B1 * | 4/2001 | Zhao | 257/522 |
| 6,265,303 B1 | 7/2001 | Lu et al. | |
| 6,297,554 B1 * | 10/2001 | Lin | 257/752 |
| 6,312,874 B1 * | 11/2001 | Chan et al. | 430/314 |
| 6,468,898 B1 * | 10/2002 | Usami | 438/638 |
| 6,479,391 B2 * | 11/2002 | Morrow et al. | 438/706 |
| 6,507,081 B2 * | 1/2003 | Smith et al. | 257/410 |
| 6,509,258 B2 * | 1/2003 | Farrar | 438/622 |

(Continued)

OTHER PUBLICATIONS

Vincent Arnal, et al., *A Novel SiO₂-Air Gap Low K for Copper Dual Damascene Interconnect*, Advanced Metallization Conference 2000, D. Edelstein, et al., Warrendale, PA, USA.
Purushothaman, *Opportunities and Challenges in Ultra Low K Dielectrics for Interconnect Applications*, 2001 IEEE.

(Continued)

*Primary Examiner*—Dean A. Reichard
*Assistant Examiner*—Hoa C. Nguyen
(74) *Attorney, Agent, or Firm*—Dennis M. Carleton

(57) ABSTRACT

An interconnect structure of a semiconductor device designed for reduced intralevel and interlevel capacitance, and includes a lower metal layer and an upper metal layer and an insulating layer interposed between metal layers. Each of the lower metal layer and upper metal layer include a plurality of conductive lines spaced apart and extending within a low-k dielectric material. A plurality of metal-filled vias interconnects the conductive lines of the lower metal layer to the conductive lines of the upper metal layer. The insulating layer comprises also comprises a low-k dielectric material disposed between the adjacent metal-filled vias. Openings, having been etched in the low-k dielectric material between the conductive lines of the upper and lower metal layers, and the metal-filled vias, an ultra-low k material is deposited within the openings. The integration of the ultra-low k and low-d dielectric materials reduces the overall capacitance of the structure to enhance performance.

8 Claims, 6 Drawing Sheets

U.S. PATENT DOCUMENTS

| | | | |
|---|---|---|---|
| 6,683,382 B2 * | 1/2004 | Cwynar et al. | 257/759 |
| 6,696,222 B2 * | 2/2004 | Hsue et al. | 430/313 |
| 6,984,577 B1 * | 1/2006 | Zhao et al. | 438/619 |
| 2002/0081787 A1 | 6/2002 | Kohl et al. | |
| 2003/0100190 A1 | 5/2003 | Cote et al. | |

OTHER PUBLICATIONS

Lytle, *Overcoming CU/CVD Low-K Integration Challenges in a High Performance Interconnect Technology*, 2001 IEEE.

Zielinski, *Damascene Integration of Copper and Ultra Low-K Xerogel for High Performance Interconnects*, 1997 IEDM.

Arnal, *Integration of a 3 Level SiO2 Air Gap Interconnect for Sub 0.1 micron CMOS Technologies*, 2001 IEEE.

* cited by examiner

SEMICONDUCTOR DEVICE HAVING REDUCED INTRA-LEVEL AND INTER-LEVEL CAPACITANCE

This application is a continuation of patent application Ser. No 10/152,305, filed on May 20, 2002 now abandoned.

BACKGROUND OF THE INVENTION

The present invention relates generally to the fabrication of interconnect structures on a semiconductor device. More specifically, the invention relates to interconnect structures incorporating low-k and ultra low-k dielectric materials, and dual damascene processes used in the fabrication of interconnect structures.

Interconnect structures are those structures on an integrated circuit device that connect different levels of a multi-level-interconnect integrated circuit device. An interconnect structure includes an upper and lower conductive metal layer separated by a dielectric layer. The conductive metal layers comprise metal lines spaced apart within a dielectric material. Conductive metal-filled vias interconnect the metal lines of the upper metal layer to the conductive lines of the lower metal layer. Typically, in a multi-level structure, the lowest metal layer is fabricated using a process known as single damascene, and the dielectric layers and upper metal layers are fabricated using a process known as dual damascene. These damascene processes are known to those skilled in the art.

Dielectric materials have relatively low conductivity and high resistivity to movement of electrons, and accordingly serve as insulators to the conductive metal structures in a semiconductor device. Interconnect delay can be reduced by decreasing the resistance of a metal layer and decreasing the capacitance of the dielectric layers. Dielectric materials having smaller permittivity values, or lower dielectric constants, reduce the capacitance of the structure. The dielectric materials separate adjacent metal lines and vias, thereby preventing shorting between the metal layers and conductive lines on the same layer. Moreover, dielectric layers are also used to separate conductive metal layers at different levels of an interconnect structure.

However, as the dimensions of semiconductor devices decrease, the overall capacitance of a device may increase. Spacing between conductive lines on the same metal layer is decreased which can increase the potential of intra-level capacitance. Similarly, if the thickness of a dielectric layer between various metal layers is decreased, the inter-level capacitance of the device structure may increase.

As a result of these decreasing dimensions of devices, dielectric materials having lower dielectric constants, known as low-k dielectric materials, have become increasingly popular in the fabrication of interconnect structures of semiconductor devices. The low-k dielectric materials typically have dielectric constants of up to about 4.0. These dielectric materials are typically organosilicates or polymeric materials. Low-k dielectric materials provide a lower intra-level and inter-level capacitance.

In addition, dielectric materials known as "ultra low-k" dielectrics have been found to further reduce the capacitance of an interconnect layer. Ultra low-k dielectrics include materials such as xerogel, aerogel and other materials having a dielectric constant of up to about 2.5. Ultra low-k dielectric materials are generally porous, brittle and lack structural integrity to support other device layers and films comprising a semiconductor device. For examples barrier/seed films do not adhere well to ultra-low k dielectrics. A barrier/seed film may peel off during metal deposition or subsequent chemical mechanical planarization of copper, and create particulates that limit device yield and performance. In addition, the porous ultra-low k materials can create uneven surfaces of the barrier/seed films, which can compromise the barrier integrity. In a worst case, gross delamination of the films may occur, producing a non-functioning device.

The use of an ultra low-k dielectric material in combination with a low-k dielectric, to reduce the capacitance of a semiconductor device, is disclosed in U.S. Pat. No. 6,159,842, issued to Chang. A conductive layer having lines 14 are formed by a subtractive etch process. A low-k dielectric material, having a dielectric constant of up to about 3.5, is deposited over the lines 14 to protect the lines 14 from an ultra low-k material deposited later. The ultra-low k dielectric material 18 is then deposited over the low-k insulating layer 16 to fill gaps between the lines 14. The top surface of layer 18 is densified by plasma treatment, and a second insulating layer 20 is deposited over the lines 14 and ultra low-k dielectric 18. The second insulating layer 20 is composed of a low-k dielectric material similar to the insulating layer 16. The Chang patent does not disclose the fabrication of the interconnect structure using a dual damascene process, and does not include the ultra low-k dielectric material between the metal-filled vias.

A dual damascene process of an interconnect structure designed to lower inter-level device capacitance is disclosed in U.S. Pat. No. 6,297,554, issued to Lin. However, Lin does not utilize an ultra low-k dielectric material. Lin creates voids in the low-k dielectric layer between adjacent metal structures which maybe difficult to achieve, and may compromise the structural integrity of the device. A CMP stopping point may be difficult to repeat from device to device without exposing the voids. In addition, slurry chemicals used in CMP can become entrapped within the voids, which will affect the function of voids. The voids are also difficult to reproduce without preventing overhang of the barrier and seed layers which leads to poor fill of interconnect metal features.

SUMMARY OF THE INVENTION

The present invention is for a method and device for the reduction of the inter-level and intra-level capacitance of a semiconductor device by integrating an ultra-low k dielectric material with a low-k dielectric material in the fabrication of an interconnect structure. A dual damascene process is preferably used to build the interconnect structure including formation of an insulating layer (also referred to as a "dielectric layer") between an upper metal layer and a lower metal layer.

The upper and lower metal layers include a plurality of conductive metal lines extending within a low-k dielectric material. The lines are spaced apart within the low-k dielectric, so the low-k dielectric material is disposed between adjacent lines. Low-k dielectric materials include those dielectric materials having a dielectric constant of up to about 4.0. Such dielectric materials are typically deposited using spin-on liquid deposition or chemical vapor deposition techniques. Trenches are patterned and etched in the dielectric material using known photolithography and etching processes. A conductive metal, such as copper, is deposited in the trenches using known deposition techniques, the copper is then planarized to form the conductive lines within the low-k dielectric.

Metal-filled vias interconnect the lines of the lower and upper metal layers. The vias are disposed within the insulating layer and are filled with a conductive metal. The conductive lines in the upper metal layer and the metal-filled vias are formed using a dual damascene process, known to those skilled in the art.

Openings are formed within the low-k dielectric material between adjacent lines on the upper and lower metal layers, and between the metal-filled vias in the low-k dielectrics. The openings are then filled with an ultra low-k dielectric material. "Ultra-low k" refers to those dielectric materials having dielectric constants of up to about 2.5, and includes, but is not limited to, xerogels and aerogels. The method of deposition of the ultra-low k material depends on the specific dielectric material chosen. For example xerogels are deposited using a liquid deposition process known as a "spin-on" technique, and is known to those skilled in the art.

In this manner, an interconnect structure is formed having metal layers and an insulating layer that integrate ultra-low k dielectric materials with low-k dielectric materials. The integrated dielectric material incorporates the structural integrity of the low-k dielectric material and the reduced capacitance of the ultra-low k dielectric material. Integration of the ultra-low k isolates the ultra-low k dielectric from any copper barrier/seed layer used to form the lines and vias thereby not compromising barrier integrity. Hence the porous ultra-low k dielectric will not compromise the structural integrity of the interconnect structure and device. Moreover, the ultra-low k dielectric reduces the intra-level capacitance of the different device layers within which the ultra-low k dielectric is integrated.

DETAILED DESCRIPTION OF THE DRAWINGS

Figure 1:
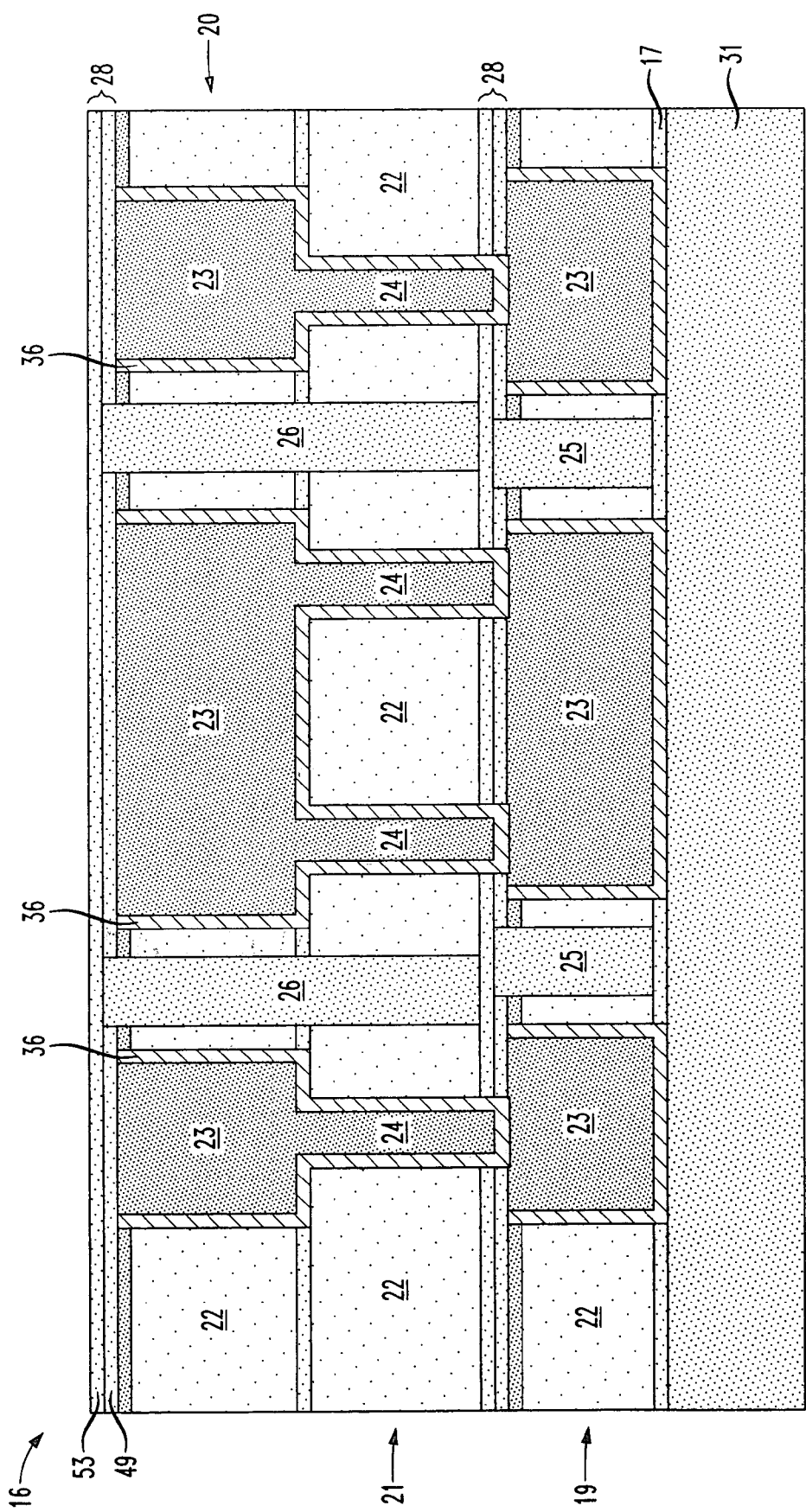
FIG. 1 is a sectional view of an interconnect structure incorporating the features of the present invention.

With respect to FIG. 1, an interconnect structure 16 is shown fabricated on a semiconductor wafer or substrate 31. The term wafer or substrate as used in this specification is understood to include structures formed thereon such as transistors, capacitors, tungsten plugs and contact levels, or other active areas on the substrate 31. The interconnect structure includes a lower metal layer 19, an upper metal layer 20 and an insulating layer 21 (also referred to as a "dielectric layer") disposed between the upper metal layer 20 and the lower metal layer 19. Acceptable low-k dielectric materials include those dielectrics having a dielectric constant of up to about 4.0, such as SILK, manufactured by Dow Chemical Company, CORAL manufactured by Novellus Systems, and/or BLACK DIAMOND, manufactured by Applied Materials.

Each of the metal layers 19 and 20 includes a plurality of conductive lines 23 disposed, and extending, within a low-k dielectric material 22. Thus, the dielectric material 22 is disposed between adjacent conductive lines 23, and serves as an insulator to prevent shorting between intra-level lines, or lines 23 on the same device layer. As will be explained in more detail below, the interconnect structure is preferably fabricated using a dual damascene process.

Barrier layers 28 seal the lines 23 from exposure to materials deposited thereon, and protect lines 23 during subsequent fabrication steps. In addition, barrier layers 28 are also referred to as diffusion barrier layers, which minimize the diffusion of the conductive metal of lines 23 into a dielectric material deposited over the metal lines 23. The barrier layer 28 may also serve as an etch stop layer during the formation of features etched in the dielectric materials deposited over the lower metal layer 19. The barrier layers 28 may include as constituents dielectric materials such as silicon oxides, silicon nitrides and/or silicon carbides or combinations of these materials.

Metal-filled vias or plugs 24 interconnect the lines 23 in the upper metal layer 20 to the lines 23 of the lower metal layer 19. The insulating layer 21 includes a low-k dielectric material 22 disposed between the plugs 24, and similarly serves as an insulator between the plugs 24, and minimizes inter-level shorting between lines in different device layers. The lines 23 and plugs 24 are typically composed of copper or a copper alloy.

An ultra low-k dielectric material 25 and 26 has been deposited in each of the layers 19, 20 and 21, in order to reduce the intra-level and inter-level capacitance of the interconnect structure 16. The ultra-low k dielectric 25 and 26, in the lower metal layer 19 and upper metal layer 20, respectively, is disposed within the low-k dielectric material 22, between adjacent lines 23. In addition, the ultra low-k dielectric 26 is deposited in the insulating layer between adjacent metal-filled vias 24. In the embodiment shown in FIG. 1, the diffusion barrier layers 28 have been deposited over the metal layers 19 and 20 to seal the ultra-low k dielectric and avoid exposure to subsequent device fabrication steps. Acceptable ultra low-k dielectrics include materials having a dielectric constant of up to about 2.5, such as ultra low-k SILK and/or porous SILK, manufactured by Dow Chemical Company.

Figure 2:
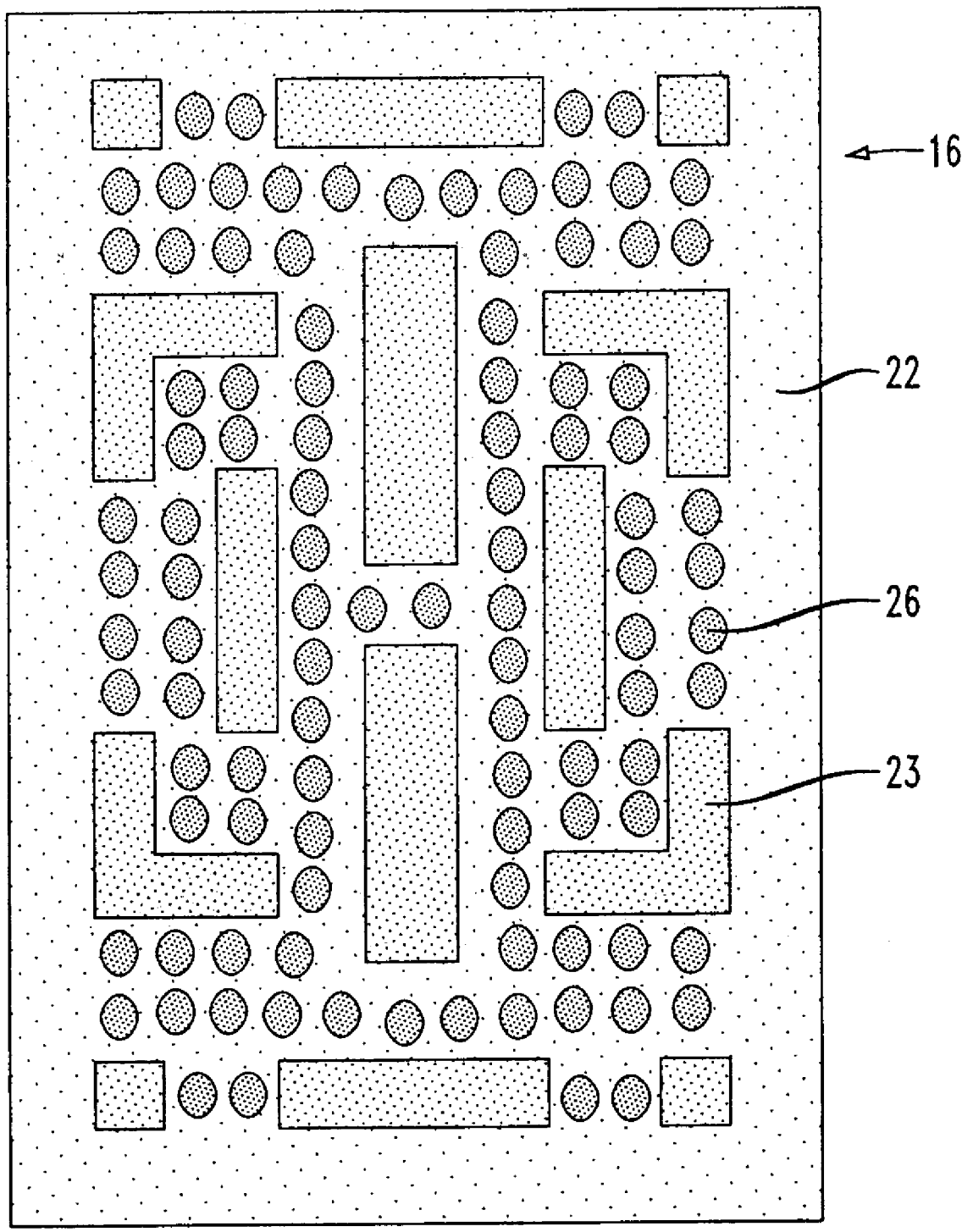
FIG. 2 is a top view of a metal layer illustrating dielectric vias disposed between metal lines.

In an embodiment, the ultra-low k dielectrics 25 and 26 are deposited within dielectric vias having been etched between metal lines 23 and metal-filled vias 24. A top view of a metal layer 19 is shown in FIG. 2, illustrating the dielectric-filled vias or columns 54 formed in the metal layer 19. As shown in FIG. 2, a plurality of vias are etched and spaced apart between the lines 23. Vias may be similarly etched between the lines 23 in the upper metal layer 20, and the metal-filled vias 24 in the insulating layer 21. An ultra-low k dielectric material is deposited within the via dielectrics forming a plurality of columns of the ultra-low k dielectric material spaced apart with respect to one another between the lines 23 and metal-filled vias 24.

The invention is not intended to be limited to the deposition of the ultra-low k dielectrics 25 and 26 in form of columns spaced apart between lines 23 and metal-filled vias 24. Nor is the invention limited to the deposition of an ultra low-k material in dielectric vias. For example, the ultra low-k-material may be deposited within the dielectric trenches etched between lines 23 and metal-filled vias 24. An etch back processes is used to planarize the ultra-low k.

Figure 3:
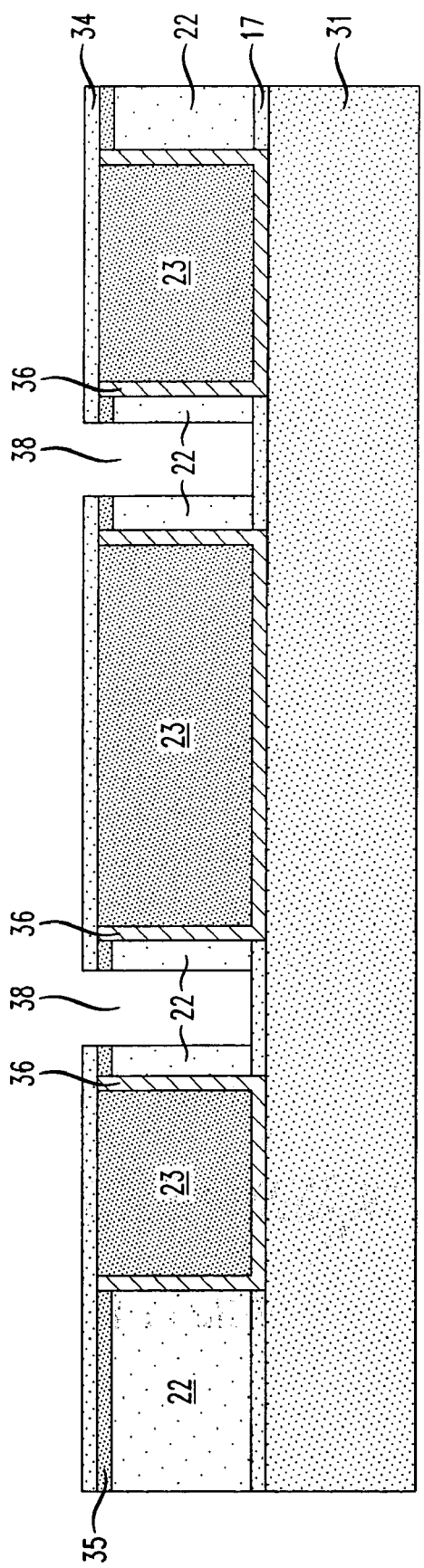
FIG. 3 is a sectional view of a metal layer having dielectric openings etched between metal lines.
Figure 4:
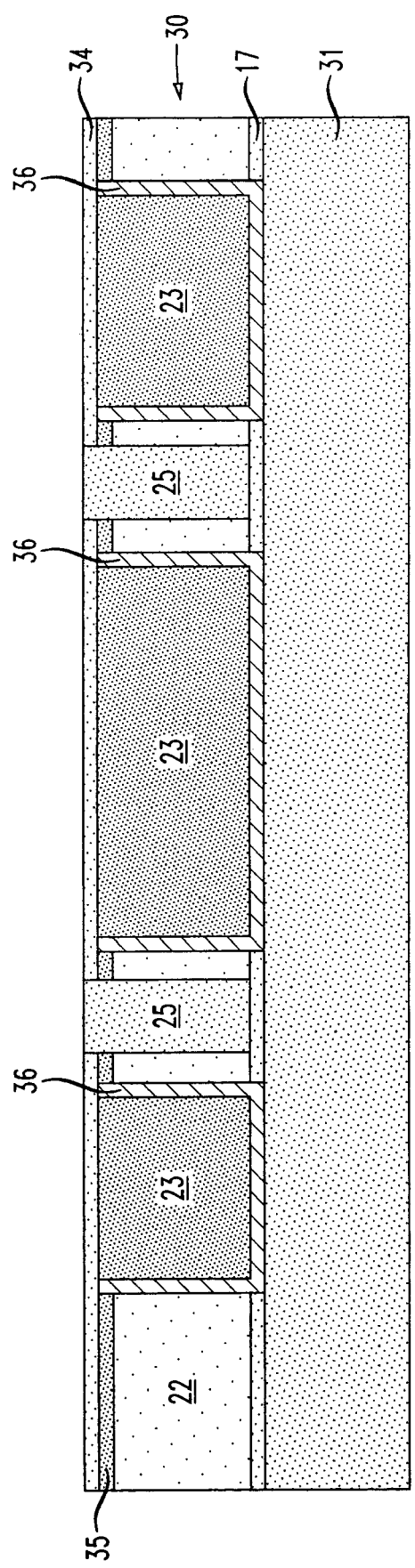
FIG. 4 is a sectional view of a metal layer having dielectric openings filled with ultra-low k dielectric material.
Figure 5:
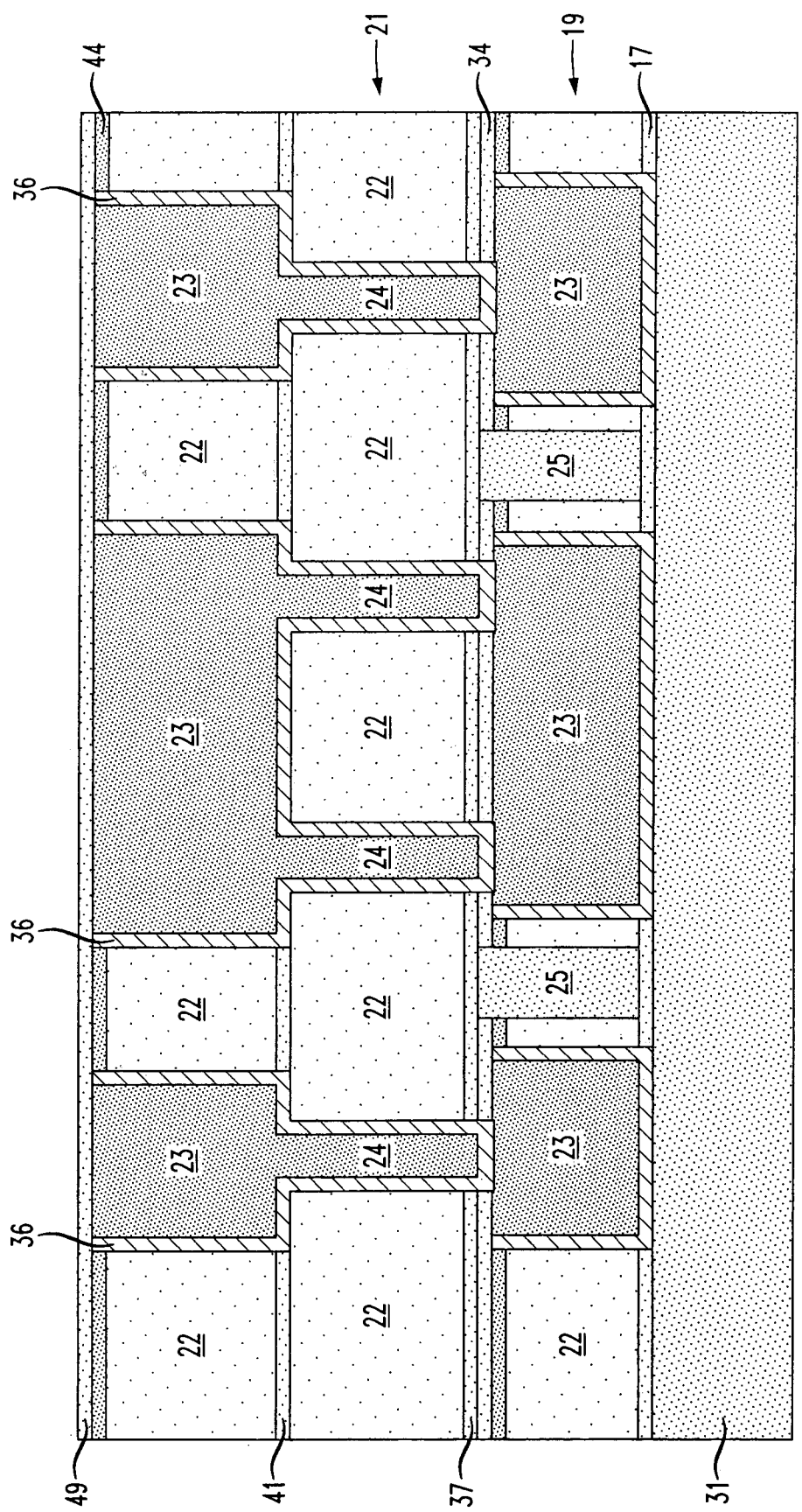
FIG. 5 is a sectional view of an interconnect structure having an ultra-low k dielectric material disposed within a lower metal layer.

With respect to FIGS. 3 through 5, the fabrication of an interconnect structure integrating low-k dielectrics and ultra-low k dielectrics is shown which reduces the overall capacitance of the structure. As shown in FIG. 2, a first or lower metal layer 19 is constructed on a semiconductor wafer 31. The metal layer 19 is constructed using a single damascene process. A low-k dielectric material 22 is deposited on an etch stop layer 17, which separates the dielectric material 22 from the underlying wafer 31 The dielectric material 22 may be planarized using techniques well known in the art to reduce the topographical effects of underlying features.

A hard mask layer 35 and a photoresist layer (not shown) are deposited over the dielectric material 22. A plurality of trench features are then patterned in the photoresist layer and then etched into the dielectric material 22. Conductive lines 23 are formed in trenches by first depositing a barrier/seed film stack 36, and then depositing copper over the barrier/seed film stack 36. Copper is typically deposited using known electroplating processes. The copper is then polished or planarized back to a predetermined level using techniques known to those skilled in the art such as chemical mechanical planarization ("CMP").

A first barrier film 34 is deposited over the metal layer 30 sealing the copper lines 23. The barrier film 34 is typically composed of a dielectric material having silicon oxides, silicon nitrides and/or silicon carbides combinations of these materials. A metal layer 19 is thereby formed having a plurality of conductive lines 23 spaced apart and extending within a low-k dielectric material 22, which is disposed between adjacent lines 23.

With reference to FIG. 3, dielectric openings 38 are formed by applying a photoresist layer (not shown) over the barrier film 34. Sites for dielectric openings 38 are patterned in the photoresist layer. The sites are aligned so the dielectric openings 38 will penetrate the dielectric material 22 between adjacent lines 23. A plurality sites for of dielectric openings 38 are spaced apart between the lines 23. Dielectric openings 38 are then etched through the barrier film 34 to a predetermined depth of the dielectric material 22 and/or to the etch stop layer 17.

As shown in FIG. 4, an ultra low-k dielectric 25 is deposited in the dielectric openings 38. The method of deposition will depend on the characteristics of dielectric material. A liquid spin-on deposition process is typically used for the deposition of xerogel, aerogels and other dielectrics having a dielectric constant up to about 2.5. The structure is blanketed with the ultra low-k dielectric 25, and the excess dielectric material deposited on the device is removed using CMP or an etch-back technique. A second barrier film 37 is then deposited over the metal layer 19 covering and sealing the ultra low-k dielectric 25. The barrier film 37 is composed of a dielectric material compatible, or the same as, the dielectric comprising the barrier film 34.

A dual damascene process is used to fabricate the remainder of the interconnect structure, including the integration of an ultra low-k dielectric with a low-k dielectric. As shown in FIG. 5, a via dielectric layer or insulation layer 21 is deposited over the first metal layer 19. The via dielectric layer 21 is composed of a low-k dielectric such as the dielectric material 22. An etch stop layer 41 is then deposited over the via dielectric material 22, and preferably comprises the same low-k dielectric as the barrier films 34 and 37, and etch stop layer 17. The low k dielectric material 22 is then deposited over the etch stop layer 41 forming the basis for the upper metal layer 20, which may also be referred to as the trench dielectric layer.

A hard mask layer 44 is then deposited over upper metal layer 20. A photoresist layer (not shown) is then formed over the hard mask layer 44. The photoresist layer in combination with the hard mask layer 44 is used for the formation of the trench and via features as will be described in more detail. The photoresist layer is typically stripped from the device between various steps then reapplied as necessary to pattern and etch a feature.

As may be appreciated by one skilled in the art, the barrier films 34 and 37, etch stop layers 41 and 17, mask layer 44 and dielectric layers 20 and 21, are preferably composed of dielectric materials. However, etch chemistries of the dielectrics of the barrier films, mask layer and etch stop layer differ from the etch chemistries of the dielectric layers so that trench and via features may be effectively transferred to desired depths of a dielectric layer without penetrating underlying layers.

A dual damascene process is then used to construct the lines 23 in the upper metal layer 20, and the metal-filled vias 24 of the insulating layer 21. A number of dual damascene processes are used to form via and trench features in respective dielectric layers including, "partial via first", "partial trench first", or "full-via-first" processes may be utilized to fabricate the interconnect structure. However, the present invention is not limited by a specific dual damascene process, or by the construction of an interconnect structure using a dual damascene process.

A conductive metal such as copper has been deposited within the trenches and vias to form the lines 23 in the upper metal layer 20, and the metal-filled vias 24 in the insulating layer 21. The copper may be deposited within the trenches and vias by first forming a diffusion barrier film and copper seed film 36 using deposition techniques such as sputter deposition or chemical vapor deposition. Copper is then deposited using an electroplating process. Copper deposited on the device outside the trench and via is removed by CMP. Then a fourth barrier film 49 is deposited over the remaining portions of the mask layer 44 and the copper conductive lines 23 in the upper metal layer 20. The lines 23 are sealed to prevent diffusion of the copper and protect the lines from subsequent fabrication steps.

Figure 6:
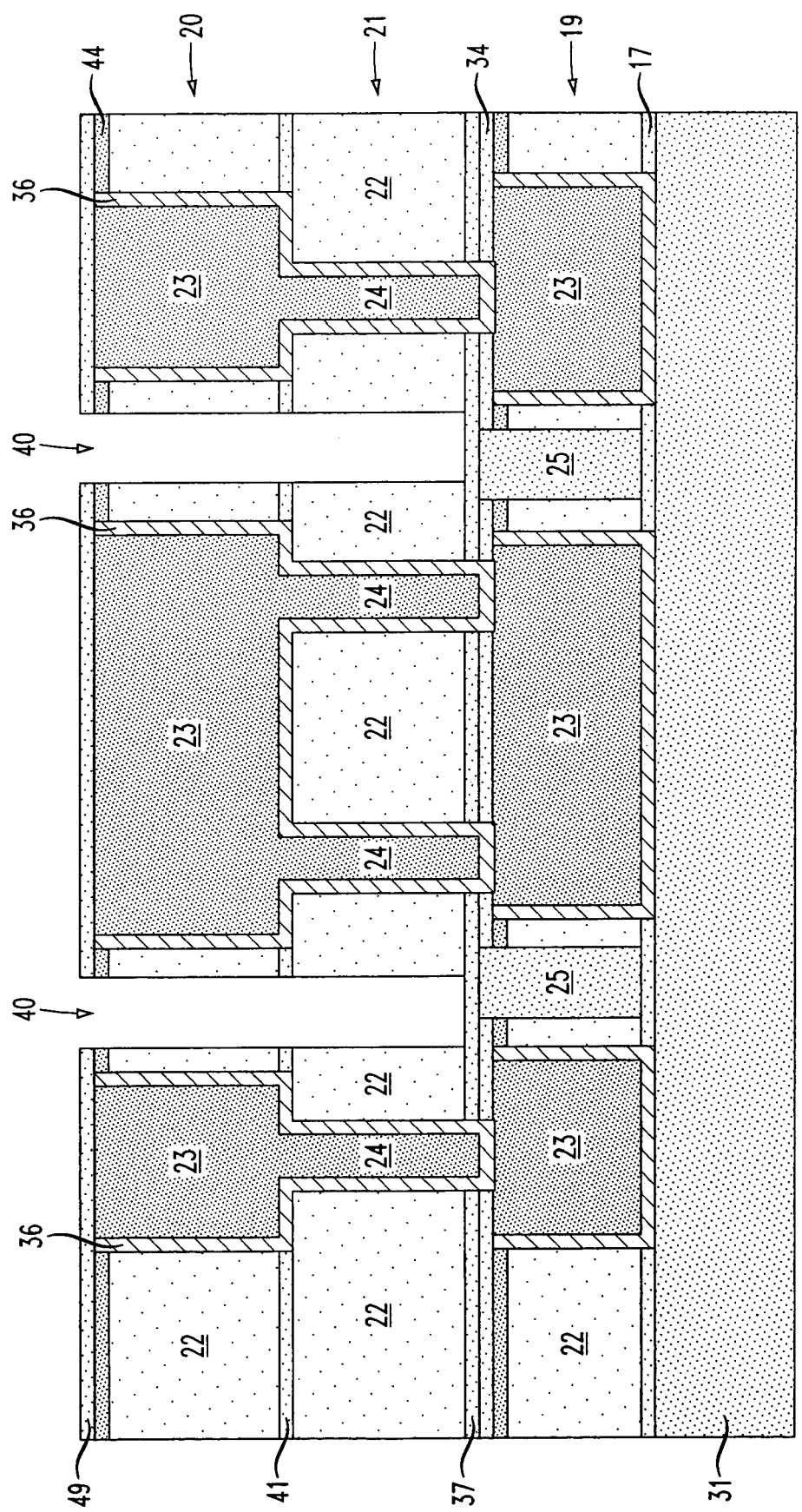
FIG. 6 is a sectional view of an interconnect structure having dielectric openings etched in an upper metal layer and an insulating layer between metal lines and metal-filled vias.

With reference to FIG. 6, openings 40 etched into the upper metal layer 20 and the insulating layer 21. A photoresist layer (not shown) is formed over the barrier film 49, and openings 40 are patterned and then etched through the upper metal layer 20 and to a predetermined depth of the insulating layer 21.

As shown in FIG. 1, an ultra low-k dielectric material 26 is then deposited in the openings 40 using liquid spin-on deposition techniques or chemical vapor deposition. Excess dielectric material deposited on the device outside the openings 40 is removed by CMP or etch back techniques known to those skilled in the art. A fifth barrier film 53 is then deposited over the fourth barrier film 49 sealing the ultra-low-dielectric 26.

While the preferred embodiments of the present invention have been shown and described herein, it will be obvious that such embodiments are provided by way of example only. Numerous variations, changes and substitutions will occur to those of skill in the art without departing from the invention herein. For example, the present invention is not limited to the fabrication of the interconnect structure using a dual damascene, but may include other processes such as single damascene or etch back procedures. Accordingly, it is intended that the invention be limited only by the spirit and scope of the appended claims.

We claim:

1. A semiconductor device having an interconnect structure comprising:
   a. a lower metal layer comprising a low-k dielectric material and a plurality of conductive lines disposed within said low-k dielectric material;
   b. an upper metal layer comprising a low-k dielectric material and a plurality of conductive lines disposed within said low-k dielectric material;
   c. an insulating layer, disposed between the lower metal layer and the upper metal layer, and comprising a low-k dielectric material;
   d. a plurality of metal-filled vias extending through the insulating layer and interconnecting the conductive lines of the lower metal layer to the conductive lines of the upper metal layer;
   e. a porous ultra low-k dielectric material regions disposed within the low-k dielectric material of the upper metal layer and the lower metal layer between adjacent conductive lines, and within the low-k dielectric material in the insulating layer;
   f. a first barrier layer interposed between the lower metal layer and the insulating layer, said first barrier layer separating the ultra low-k material regions of the lower metal layer from the ultra low-k material regions of the insulating layer; and
   g. a second barrier layer disposed over the upper metal layer, wherein said first barrier layer and said second barrier layer each have a first film and a second film disposed over the first film, wherein said first film covers the conductive lines and said porous ultra low-k dielectric material regions extend through said first film to said second film, which covers said ultra low-k dielectric material regions.

2. The semiconductor device of claim 1 wherein said porous ultra low-k dielectric material regions are formed in a plurality of ultra low-k dielectric-filled openings, each said dielectric-filled opening disposed within the low-k dielectric material between the metal lines in the upper metal layer and the lower metal layer.

3. The semiconductor device of claim 2 wherein said porous ultra low-k dielectric filled openings include openings extending from the upper metal layer to a predetermined depth of the insulating layer, which opening extend between the metal lines in the upper metal layer and the metal filled vias in the insulating layer.

4. The semiconductor device of claim 1 wherein said porous ultra low-k dielectric material regions include a plurality of ultra-low k dielectric columns, spaced apart and disposed within the low-k dielectric material of at least one of the layers including the lower metal layer, upper metal layer and the insulating layer.

5. The semiconductor device of claim 1 wherein the lines predominantly comprise copper.

6. The semiconductor device of claim 1 wherein the upper surface of the porous ultra low-k dielectric regions are substantially planar.

7. The semiconductor device of claim 1 wherein one of the porous ultra low-k dielectric regions is formed over another of the porous ultra low-k dielectric regions.

8. The semiconductor device of claim 1 wherein the porous ultra low-k dielectric material regions extend through at least the low-k dielectric material of the insulating layer and the low-k dielectric material of the upper metal layer.

* * * * *